United States Patent [19]

Meadows

[11] Patent Number: 4,962,380
[45] Date of Patent: Oct. 9, 1990

[54] METHOD AND APPARATUS FOR CALIBRATING AN INTERLEAVED DIGITIZER

[75] Inventor: Robert D. Meadows, Beaverton, Oreg.

[73] Assignee: Tektronix, Inc., Beaverton, Oreg.

[21] Appl. No.: 410,687

[22] Filed: Sep. 21, 1989

[51] Int. Cl.$^5$ ............................................. H03M 1/10
[52] U.S. Cl. ..................... 341/120; 341/122; 341/155
[58] Field of Search ............... 341/120, 121, 123, 122, 341/155

[56] References Cited

U.S. PATENT DOCUMENTS 4,736,189  4/1988  Katsumata et al. ................. 341/120
4,763,105  8/1988  Jeng.

Primary Examiner—William M. Shoop, Jr.
Assistant Examiner—Brian Young
Attorney, Agent, or Firm—Peter J. Meza

[57] ABSTRACT

An apparatus and method for calibrating an interleaved digitizer includes a system oscillator for generating a master clock signal and two or more cascaded phase shifting circuits for producing clock signals that are phase shifted copies of the master clock signal. The calibrator further includes two or more A/D converters for digitizing the master clock signal at time intervals provided by the phase shifted clock signals to produce a digitized output. The digitized output is then stored in a memory. Once stored, the digitized output is compared to predetermined reference levels and the phase shift of the phase shifting circuits is appropriately adjusted as a function of the difference between the stored digitized output and the predetermined reference levels. After the phase shift of each of the phase shifting circuits has been adjusted the digitizer input is switched from digitizing the master clock signal to digitizing an analog input signal, thus converting the calibrator into an accurately calibrated digitizing system.

16 Claims, 1 Drawing Sheet

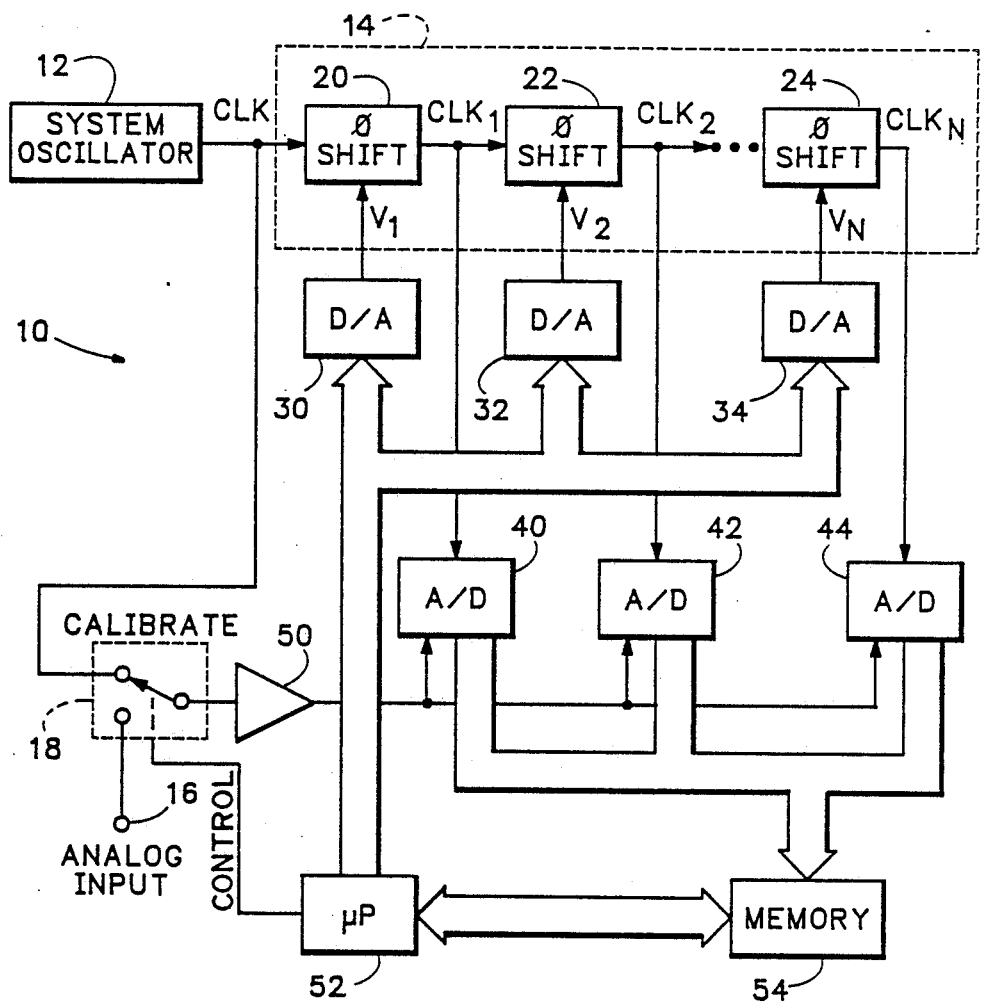

METHOD AND APPARATUS FOR CALIBRATING AN INTERLEAVED DIGITIZER

BACKGROUND OF THE INVENTION

This invention relates to a method and apparatus for calibrating interleaved digitizers.

Interleaved digitizers contain two or more analog to digital ("A/D") converters that are strobed by clock signals that are phase shifted copies of a master clock signal In this way the digitizer samples an analog input signal two or more times per cycle, thus increasing the effective sample rate of the digitizer. However, the digitizer must be calibrated in order that the input is sampled at equal time intervals and not time skewed due to errors in the clock generator circuit or other phase and delay errors in the digitizer system.

Prior art calibration techniques involve elaborate procedures or precision ramp generators. What is desired is a calibration method and apparatus that is simple and easy to implement.

SUMMARY

Therefore, according to the present invention, an apparatus for calibrating an interleaved digitizer includes a system oscillator for generating a master clock signal and two or more cascaded phase shifting circuits for producing clock signals that are phase shifted copies of the master clock signal. The calibrator further includes two or more A/D converters for digitizing the master clock signal at time intervals provided by the phase shifted clock signals to produce a digitized output. The digitized output is then stored in a memory. Once stored, the digitized output is compared to predetermined reference levels and the phase shift of the phase shifting circuits is appropriately adjusted as a function of the difference between the stored digitized output and the predetermined reference levels. After the phase shift of each of the phase shifting circuits has been adjusted the digitizer input is switched from digitizing the master clock signal to digitizing an analog input signal, thus converting the calibrator into an accurately calibrated digitizing system.

Therefore the calibrator according to the present invention is easily implemented in that it uses few parts that are not already required for the interleaved digitizer and uses a simple algorithm for determining the correct value of phase shift for each phase shifting circuit

BRIEF DESCRIPTION OF THE DRAWINGS

The SOLE FIGURE is a block diagram of calibrator for an interleaved digitizer according to the present invention.

DESCRIPTION OF THE PREFERRED EMBODIMENT

The SOLE FIGURE shows an apparatus for calibrating an interleaved digitizer 10 including a system oscillator 12 for generating a master clock signal labeled CLK. At high frequencies, the master clock signal is typically a sinusoid. The master clock signal CLK is an input for a clock or timing generation circuit 14. Clock generation circuit 14 includes two or more cascaded phase shifting circuits 20, 22, through 24 for producing a plurality of phase shifted clock signals $CLK_1$, $CLK_2$, through $CLK_N$. The phase shift circuits are ideally fabricated in an integrated circuit 14 wherein the phase shift of each phase shift circuit is variable in response to analog control signals V1, V2, through $V_N$. Such a circuit is the M466A Clock Driver Integrated Circuit manufactured by Tektronix, Inc. of Beaverton, Oreg. Digital to analog ("D/A") converters 30, 32, through 34 are provided to generate the analog control voltage in response to a digital word. Alternatively, phase shifting circuits 20, 22, through 24 may be of the type in which the phase is directly controlled by a digital word. If desired, phase shift circuits 20, 22, through 24 may be discrete circuits of any conventional variety having a variable controlled phase shift.

The master clock signal CLK is digitized at time intervals determined by the phase shifted clock signals $CLK_1$, $CLK_2$, and $CLK_N$. The clock signals are used to strobe A/D converters 40, 42, through 44 to produce a digitized output that is stored in a memory 54. Due to the speed of the digitized output, the memory 54 may be separated into multiple segments. The master clock signal CLK is passed through a switch 18 and through signal conditioning circuitry such as buffer amplifier 50 to the input of A/D converters 40, 42, through 44. Switch 18 is under the control of a microprocessor 52 that is also in communication with memory 54 and D/A converters 30, 32, through 34.

Once at least one cycle of the master clock signal CLK has been stored in memory 54 the stored samples are then compared to predetermined reference levels for subsequent adjustment of the analog control voltages $V_1$, $V_2$, through $V_N$ of phase shifting circuits 20, 22, through 24. Appropriate reference levels are chosen for the number of interleaved A/D converters. For example, if the sample rate of the interleaved digitizer is increased by a factor of four, four A/D converters are required and the ideal normalized reference levels are sin(pi/4), sin(3pi/4), sin(5pi/4) and sin(7pi/4). These reference levels are chosen to provide an acceptable derivative of voltage versus phase. If the reference levels are set to sin(O), sin(pi/2), sin(pi), and sin(3pi/2) the derivative of voltage versus phase at these levels is zero. Such an undesirable selection of the reference voltage levels does not provide effective information when the stored sample data is close to the reference level. Once the comparison between the stored data and the ideal reference levels has been made the phase shift of each of the phase shifting circuits 20, 22, through 24 is adjusted as a function of the difference between the stored digitized output and the predetermined reference levels. For example, if the first sample is found to have a value less than 0.707 times the magnitude of the clock signal, the phase shift of phase shifting circuit 20 must be increased, since the value of sin(pi/4) is approximately equal to 0.707. Similarly, if the first sample is found to have a value greater than 0.707 times the magnitude of the clock signal, the phase shift of phase shifting circuit 20 must be reduced. Once the value of the phase shift for the first phase shifting circuit is determined, the procedure is repeated until, in this case, the phase shift of all four phase shifting circuits is determined.

After the phase shift of each of the phase shifting circuits 20, 22, through 24 has been adjusted the calibration is complete. The calibrator 10 is then switched from digitizing the master clock signal CLK to digitizing an analog input signal received on input node 16 by switch 18 under microprocessor control. Thus, the calibrator 10 is converted into an accurately calibrated digitizing system using the existing hardware If the phase shifting circuits or system oscillator used contain significant phase noise it may be desirable to digitize the average value of the master clock signal CLK over several clock cycles to produce a more accurate calibration. Thus, the master clock signal is digitized over N cycles where N is an integer larger than unity The total value of the sampled master clock signal CLK is stored in memory 54 and divided by N to provide an average value. The calibration procedure proceeds as before, but the phase shift of the phase shifting circuits is adjusted as a function of the difference between the reference levels and the averaged stored values.

Thus it has been shown that the calibrator according to the present invention is easily implemented in that it uses few parts that are not already required for the interleaved digitizer and uses a simple algorithm for determining the correct value of phase shift for each phase shifting circuit.

While a preferred embodiment of the present invention has been shown and described, it is apparent to those skilled in the art that many changes and modifications may be made without departing from the invention in its broader aspects. The appended claims are therefore intended to cover all such changes and modifications as fall within the true spirit and scope of the invention.

I claim:

1. An apparatus for calibrating an interleaved digitizer comprising:
    (a) a system oscillator for generating a master clock signal;
    (b) a plurality of cascaded phase shifting circuits for producing a plurality of phase shifted clock signals from the master clock signal;
    (c) means for digitizing the master clock signal at time intervals determined by the phase shifted clock signals to produce a digitized output;
    (d) means for storing the digitized output of the digitizing means;
    (e) means for comparing the stored digitized output to predetermined reference levels; and
    (f) means for adjusting the phase shift of each of the phase shifting circuits as a function of the difference between the stored digitized output and the predetermined reference levels.

2. An apparatus as in claim 1 further comprising means for switching between the master clock signal and an analog input signal such that the digitizing means digitizes the analog input signal after the phase shift of each of the phase shifting circuits has been adjusted.

3. An apparatus as in claim 1 wherein the master clock signal is sinusoidal.

4. An apparatus as in claim 3 wherein the plurality of phase shifting circuits comprises first, second, third, and fourth phase shifting circuits 5. An apparatus as in claim 4 wherein the nominal phase shift of the first phase shifting circuit is set to pi/4 and the nominal phase shift of each of the second, third, and fourth phase shifting circuits is set to pi/2.

6. An apparatus as in claim 4 wherein the predetermined reference levels comprise first and second reference levels equal to the square root of two divided by two times the magnitude of the master clock signal and third and fourth reference levels equal to the negative of the square root of two divided by two times the magnitude of the master clock signal.

7. An apparatus for calibrating an interleaved digitizer comprising:
    (a) a system oscillator for generating a master clock signal;
    (b) a plurality of cascaded phase shifting circuits for producing a plurality of phase shifted clock signals from the master clock signal;
    (c) means for digitizing the master clock signal for a duration of N clock cycles where N is an integer greater than 1 at time intervals determined by the phase shifted clock signals;
    (d) means for storing and averaging the digitized output of the digitizing means at each determined time interval;
    (e) means for comparing the stored and averaged digitized output to predetermined reference levels; and
    (f) means for adjusting the phase shift of each of the phase shifting circuits as a function of the difference between the stored and averaged digitized output and the predetermined reference levels.

8. An apparatus as in claim 7 further comprising means for switching between the master clock signal and an analog input signal such that the digitizing means digitizes the analog input signal after the phase shift of each of the phase shifting circuits has been adjusted.

9. An apparatus as in claim 7 wherein the master clock signal is sinusoidal.

10. An apparatus as in claim 9 wherein the plurality of phase shifting circuits comprises first, second, third, and fourth phase shifting circuits.

11. An apparatus as in claim 10 wherein the nominal phase shift of the first phase shifting circuit is set to pi/4 and the nominal phase shift of each of the second, third, and fourth phase shifting circuits is set to pi/2.

12. An apparatus as in claim 10 wherein the predetermined reference levels comprise first and second reference levels equal to the square root of two divided by two times the magnitude of the master clock signal and third and fourth reference levels equal to the negative of the square root of two divided by two times the magnitude of the master clock signal.

13. A method for calibrating an interleaved digitizer comprising the steps of:
    (a) generating a sinusoidal master clock signal;
    (b) generating a plurality of phase shifted clock signals from the master clock signal;
    (c) digitizing the master clock signal at time intervals determined by the phase shifted clock signals to produce a digitized output;
    (d) storing the digitized output of the digitizing means;
    (e) comparing the stored digitized output to predetermined reference levels; and
    (f) adjusting the phase shift of each of the phase shifting circuits as a function of the difference between the stored digitized output and the predetermined reference levels.

14. A method for calibrating an interleaved digitizer as in claim 13 further comprising the step of switching between the master clock signal and an analog input signal such that the digitizing means digitizes the analog input signal after the phase shift of each of the phase shifting circuits has been adjusted.

15. A method for calibrating an interleaved digitizer comprising the steps of:

(a) generating a sinusoidal master clock signal;
(b) generating a plurality of phase shifted clock signals from the master clock signal;
(c) digitizing the master clock signal for a duration of N clock cycles where N is an integer greater than 1 at time intervals determined by the phase shifted clock signals;
(d) storing and averaging the digitized output of the digitizing means at each determined time interval;
(e) comparing the stored and averaged digitized output to predetermined reference levels; and
(f) adjusting the phase shift of each of the phase shifting circuits as a function of the difference between the stored and averaged digitized output and the predetermined reference levels.

16. A method for calibrating an interleaved digitizer as in claim 15 further comprising the step of switching between the master clock signal and an analog input signal such that the digitizing means digitizes the analog input signal after the phase shift of each of the phase shifting circuits has been adjusted.

* * * * *